(12) United States Patent
Schmidhammer et al.

(10) Patent No.: US 10,020,827 B2
(45) Date of Patent: Jul. 10, 2018

(54) HF FILTER MODULE WITH IMPROVED EXPANDABILITY

(71) Applicant: SNAPTRACK, INC., San Diego, CA (US)

(72) Inventors: Edgar Schmidhammer, Stein an der Traun (DE); Thomas Metzger, München (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/510,378

(22) PCT Filed: Jul. 22, 2015

(86) PCT No.: PCT/EP2015/066775
§ 371 (c)(1),
(2) Date: Mar. 10, 2017

(87) PCT Pub. No.: WO2016/037752
PCT Pub. Date: Mar. 17, 2016

(65) Prior Publication Data
US 2017/0272104 A1 Sep. 21, 2017

(30) Foreign Application Priority Data
Sep. 10, 2014 (DE) .................. 10 2014 113 052

(51) Int. Cl.
H04B 1/44 (2006.01)
H04B 1/00 (2006.01)

(52) U.S. Cl.
CPC ............... *H04B 1/006* (2013.01); *H04B 1/44* (2013.01)

(58) Field of Classification Search
CPC ................................. H04B 1/006; H04B 1/44
See application file for complete search history.

(56) References Cited

U.S. PATENT DOCUMENTS 7,142,884 B2 * 11/2006 Hagn ..................... H04B 1/005
455/552.1
2014/0167877 A1 * 6/2014 Shimizu .................. H03H 7/38
333/101

OTHER PUBLICATIONS

International Search Report and Written Opinion—PCT/EP2015/066775—ISA/EPO—dated Oct. 28, 2015.

* cited by examiner

*Primary Examiner* — Tuan H Nguyen
(74) *Attorney, Agent, or Firm* — Patterson & Sheridan, L.L.P. Qualcomm

(57) ABSTRACT

The invention relates to an HF module, the filter functionality of which can easily be expanded and which has good electrical properties. For this purpose, the module comprises two filter units with a respective HF filter and a switch having two possible switching states. The two filter units are connected in parallel.

12 Claims, 7 Drawing Sheets

HF FILTER MODULE WITH IMPROVED EXPANDABILITY

The invention relates to high-frequency (HF) modules, e.g. filter modules for mobile communication devices, which can easily be expanded by a plurality of filters for additional frequency bands to be covered.

HF modules can be used in mobile radio devices and can, for example, comprise HF filters of a front end. Such modules and their contained HF filters are responsible for ensuring that, in a mobile radio device, the HF signals with the correct frequencies can be transmitted to the appropriate receiving amplifiers and HF signals with the correct frequencies can be transmitted by a power amplifier to an antenna, without interfering with one another. It is problematic that modern communication devices are to be designed to be able to process an ever increasing number of frequency bands or transmission systems. The so-called "carrier aggregation," i.e. the combination of different frequency bands for an expanded bandwidth requirement, brings conventional HF modules to their limits.

It is possible to connect a plurality of HF filters with multi-switches in the signal path of a front-end module, in order to assign the associated signal paths to relevant signals via the appropriate HF filter. Such multi-switches have a plurality of switch positions, which, on the one hand, reduces the signal quality and, on the other hand, makes expandability difficult. Because, if an HF module is to be able to transmit additional frequency bands or different frequency bands at the same time, the multi-switch generally must be replaced by an expanded multi-switch to be newly designed with even higher internal circuit complexity.

The expansion of an HF module furthermore entails the problem that additional circuit components must be accommodated in a structural element, without different circuit components interfering with one another.

It is therefore the task of the present invention to provide a module that can be adapted more easily to an increasing bandwidth requirement, makes possible a higher component density without much additional design effort, and allows for an improved signal quality. The module is furthermore to be able to allow a duplexer functionality, wherein the isolation between the individual (duplexer) filters or between the associated switches is increased.

It is furthermore the task of the invention to provide appropriate uses for such a module. These tasks are solved by the objects of the independent claims. Dependent claims specify advantageous embodiments.

For this purpose, an HF module comprises two filter units. In doing so, each of the two filter units contains a first HF filter with an input and an output as well as a first switch with two possible switching states. In each filter unit, the first switch is connected to the input or the output of the first HF filter. The two filter units themselves are connected in parallel to one another.

The first switch and the first filter can be connected in series in each filter unit. In one of the two possible switching states, the input of the first switch is electrically conductively connected to the output of the first switch, which is connected in series to the HF filter. In the associated second possible switching state, the input of the first switch can be disconnected from the first HF filter.

The easier expandability of the HF module is obtained by providing a filter unit per frequency band to be covered. In doing so, each first HF filter of the respective filter unit can be activated but also deactivated via the first switch in the module. The need for multi-switches is eliminated. The task of a multi-switch is transferred to a plurality of double switches, wherein as a rule, only a small number of double switches, such as one or two, allows for a signal flow through an HF filter so that the entire circuit complexity of the active switches is reduced and the signal quality is improved. The increase of the circuit complexity by a higher number of double switches is more than compensated for by the reduction of the circuit complexity per switch.

In this case, all first switches of all filter units can be connected to a common signal bus. All signal outputs of the first filters can be connected to an additional signal bus or can be connected to such a bus via additional switches. The circuit complexity of the entire HF module thus only increases linearly with the number of HF filters to be covered. Each filter unit with its switch and its HF filter can be realized such that an assembly of a plurality of filter units, for example arranged in a stacked manner or next to one another, is possible without problems and virtually without HF conductor path crossings.

By the combination of filters and switches in a filter unit, a higher component density can be realized, since the respective units have less space requirement as a result of a possible 3D integration, in which circuit components are stacked on top of one another or filter units are stacked on top of one another. The clearly simplified signal routing improves the signal quality and increases the isolation, such as in the case of a duplexer. The individual filters of different filter units can be arranged physically at a distance to one another. The realization of the different simplified switches can be carried out on a common chip. It is then possible to improve the signal quality by connecting the different switches galvanically not on the chip but externally.

It is also possible for the following to apply to at least one filter unit: The filter unit comprises a second switch, which in turn has two possible switching states. The first switch is connected to the input of the HF filter, and the second switch is connected to the output of the HF filter. The first HF filter is thus connected between the first switch and the second switch. If the first switches are connected to a first signal bus and the second switches are connected to a second signal bus, the first HF filters can be connected individually to no signal bus, only to the first signal bus, only to the second signal bus, or to both signal buses.

It is additionally possible that at least one filter unit comprises a second filter with an input and an output. The second filter is connected in parallel to the first filter. The first filter and the second filter of the respective filter unit can be realized with respect to their center frequencies and (in case of a band-pass filter) with respect to their bandwidths such that the respective filter unit implements a duplexer.

A duplexer functionality is thus possible per filter unit. By providing additional filters and additional double switches, quadplexers or hexaplexers can, however, also be provided per filter unit.

It is additionally possible that at least one filter unit comprises a third switch with two possible switching states. The third switch is then connected to the input of the second filter.

If the two filters constitute the filters of a duplexer, it is possible that the first switch is connected to a signal path selected from the transmission signal path and received signal path of the duplexer. The third switch is then accordingly connected to the respectively other of the two signal paths listed above. The second switch is connected to the common signal path, such as an antenna signal path.

It is additionally possible that each switch in at least one filter unit has three connectors. In this case, each switch has a first connector, via which it is connected to an HF filter of the filter unit. It is additionally possible that each switch is connected with the second of the three connectors to a terminating impedance.

An impedance adjustment can take place via the terminating impedance. For example, it is possible to provide a termination via an appropriate impedance value against ground in order to exclude undesired reflections, for example.

It is additionally possible that in at least one filter unit, each switch is connected with its third of the three connectors to a signal bus. In doing so, the first switch can be connected via its third connector to a first signal bus and the second switch can be connected via its third connector to a second signal bus.

It is thus possible to exchange HF signals between the first signal bus and the second signal bus via an optimally adapted HF filter, which is selected by the respective switch position of the filter units.

It is additionally possible that at least one filter unit comprises a control circuit, by means of which the switching states of the switches of the filter unit can be controlled. In this case, the control circuit decodes a control signal, which can be received from an external circuit environment, and generates the respective switch signals directed to the individual switches.

It is additionally possible that the third connector of the first switch of a filter unit is connected to a transmission amplifier.

The transmission amplifier can in this case be a conventional power amplifier, such as a multi-mode-multi-band power amplifier (MMMB-PA).

It is additionally possible that the third connector of the second switch of a filter unit is connected to an antenna connector.

The antenna connector can in this case be connected to an antenna of a communication device.

It is additionally possible that the third connector of the third switch of a filter unit is connected to a receiving amplifier.

The receiving amplifier can, for example, be a conventional low-noise amplifier.

It is in particular possible that all third connectors of the first switches of all filter units are connected to a transmission amplifier. It is furthermore possible that all third connectors of the second switches of all filter units are connected to an antenna connector.

It is also possible that all third connectors of the third switches of all filter units are connected to a receiving amplifier.

The connection of the third connectors of the first switches of all filter units can in this case be realized via a first signal bus. The connection of the third connectors of the second switches of all filter units can be realized via a common second signal bus. The connection of all third connectors of the third switches of all filter units can be carried out via a common third signal bus.

In doing so, the number of filter units is not limited to two. The HF module can comprise one or more additional filter units. The number of filter units can in particular also be five, six, seven, eight, nine, or ten.

It is additionally possible that all filter units have the same circuit topology. The HF filters of the filter units can respectively be band-pass filters and can respectively differ in their bandwidths and/or center frequencies.

In doing so, it is preferred that HF filters of the same filter unit comprise passbands directly adjacent to one another.

An HF module described above can, for example, be used in a mobile radio device, e.g. in a mobile telephone, or in a mobile radio unit, e.g. in a motor vehicle. The use in so-called SMART cells or so-called pico cells is also possible. The use in WLAN routers or WLAN end user devices or, for example, in objects of the "internet of things," such as objects of daily and conscious or unconscious use is also possible.

The HF module, its structure, and its functionality are explained in more detail below with reference to schematic figures.

Shown are:

FIG. 1: the principal structure of the module,

FIG. 2: the naming of the inputs and outputs of the circuit components of a filter unit, FIG. 3: the schematic structure of a filter unit with two switches and an HF filter, FIG. 4: the schematic structure of a filter unit with three switches and two HF filters, FIG. 5: a summary overview of a module with a filter unit with a control circuit, FIG. 6: a possible connection of terminating impedances within a filter unit, FIG. 7: an overview of a module with a filter unit with an HF filter, two switches, and a control circuit, FIG. 8: an overview of a module with a filter unit with two HF filters, three switches, and a control circuit, FIG. 9: the diagram of the easy expandability by adding additional filter units in order to be able to cover additional frequency bands, wherein the filter units are connected to an amplifier via a common signal bus, FIG. 10: the easy expandability, in which all filter units are connected to a low-noise amplifier via a common signal bus, FIG. 11: the easy expandability in the case of filter units that are designed as duplexers, FIG. 12: a possible physical realization by stacked filter units, FIG. 13: an alternative possible realization by filter units arranged next to one another.

FIG. 1 shows the fundamental diagram, according to which an HF module M with its filter units FE1, FE2 is realized. Within the module M, the first filter unit FE1 and the second filter unit FE2 are connected in parallel. Each of the two filter units has a first switch SW1 and a first HF filter HF-F. The two first switches have a signal input and allow for two possible switching states. In respectively one of the two switching states, the signal input of the respectively first switch is connected to the respectively (first) HF filter HF-F.

By adding identical or similar filter units, the module can be adapted without much effort and in particular without a big change of the fundamental circuit topology to a plurality of frequency bands. If the carrier aggregation is to be used, a combination of different HF filters can in particular be activated via the switch position of the first switches. The circuit complexity is reduced compared to conventional HF modules, because only double switches are required. The extensive circuit complexity of multi-switches is eliminated.

FIG. 2 illustrates the naming of different connectors: The HF filter is connected via an input I to the switch SW, namely via its first connector A1. The third connector A3 of the switch SW implements a signal input of the filter unit FE. Via a second connector A2 of the switch SW, the switch SW can be connected to a terminating impedance.

FIG. 3 illustrates the naming of the connectors of the second switch SW2: Via the first connector A1 of the second switch SW2, the second switch SW2 is connected to the HF filter. Via the third connector A3 of the second switch SW2, the filter unit FE can be connected to its output. Via a second connector A2 of the second switch SW2, the switch can be connected to a terminating impedance.

The signal direction of the switches and filters shown in FIGS. 2 and 3 can also be reversed so that a signal can be routed from the second switch SW2 via the filter to the first switch SW1.

FIG. 4 illustrates the naming of the connectors of the third switch. The first connector A1 of the third switch SW3 is thus connected to the second filter. Via the third connector A3 of the third switch SW3, the filter unit FE can be connected to a signal bus provided for the connection to the third switch SW3. Via the second connector A2, the third switch SW3 can be connected to ground via a terminating impedance.

It thus applies to all three switches SW1, SW2, SW3 of a filter unit FE, that the first connector is respectively provided for the connection to a filter. The second connectors A2 can be provided for the connection to a terminating impedance. The third connectors can be provided for the connection with one of the three possible signal buses.

FIG. 5 shows an embodiment, in which the HF module M comprises a filter unit FE, in which the switch position of the first switch SW1 is controlled by a control circuit STS.

The control circuit STS can in this case receive control signals of an external circuit environment and convert them into corresponding action signals for the switch SW1.

Figure 1:
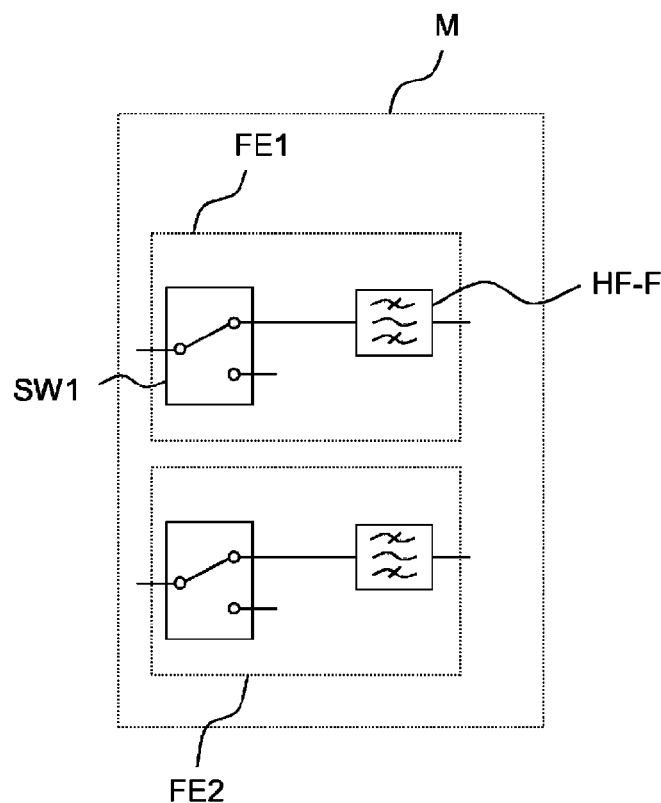
Figure 2:
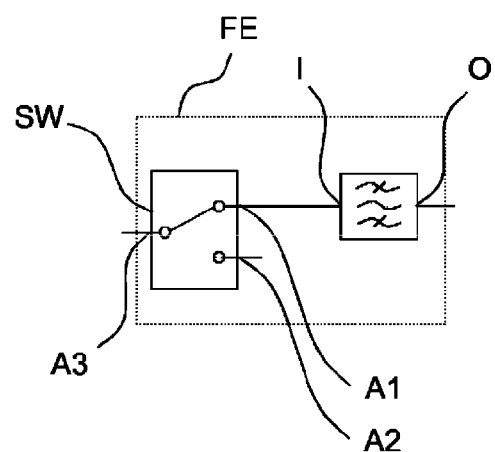
Figure 3:
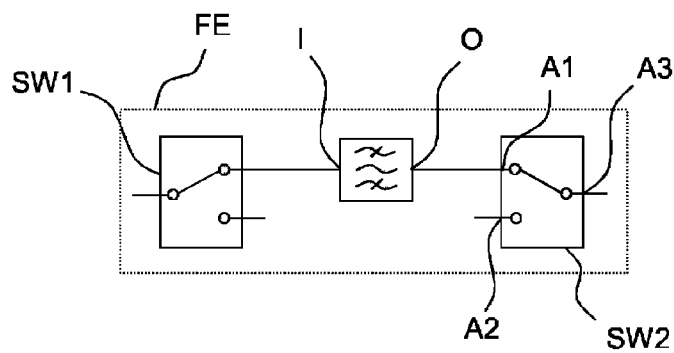
Figure 4:
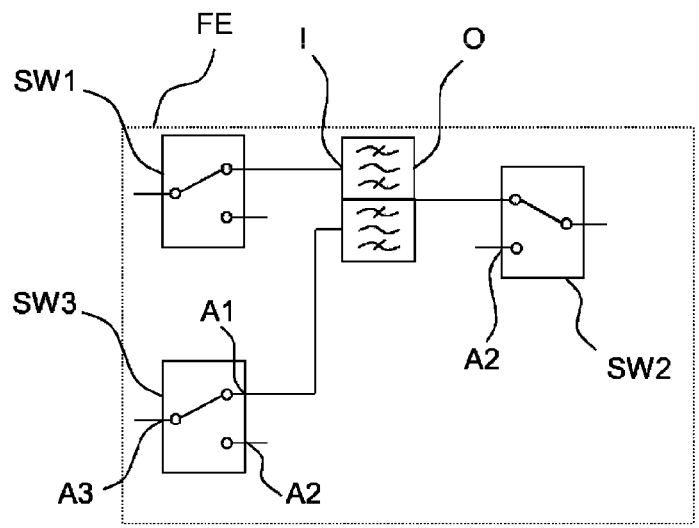
Figure 5:
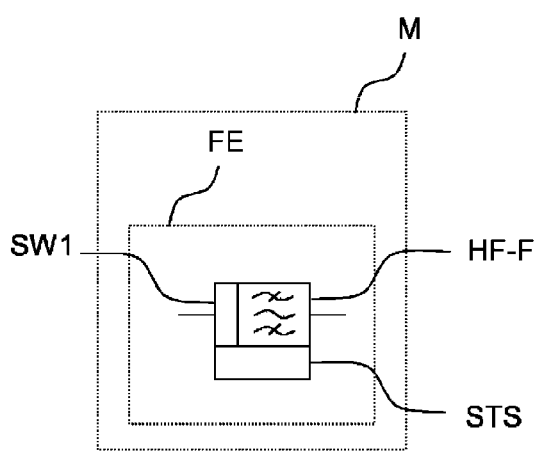
Figure 6:
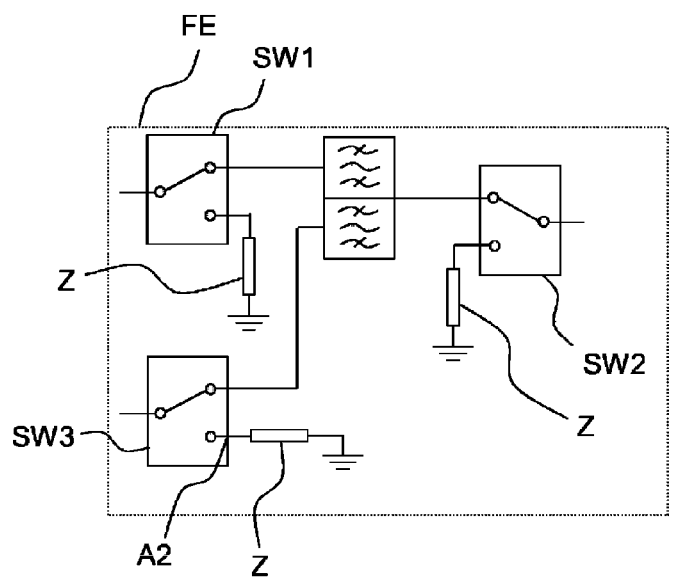
FIG. 6 shows an embodiment of a filter unit FE with three switches, two HF filters, and three terminating impedances Z. The second connector A2 of the three switches SW1, SW2, SW3 is respectively connected to ground via a terminating impedance Z.
Figure 7:
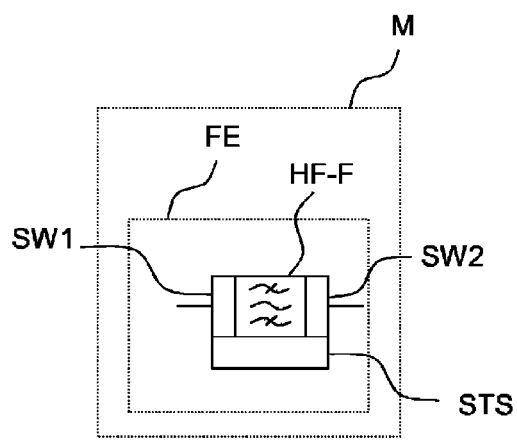
FIG. 7 shows an embodiment of a filter unit FE in an HF module M, in which a control circuit STS controls the switching states of the two switches SW1, SW2.
Figure 8:
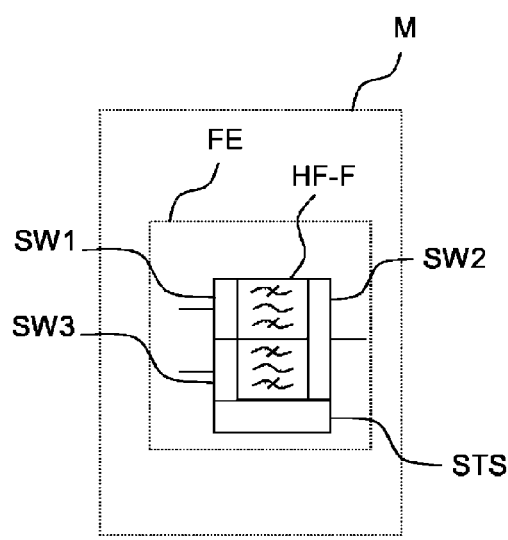
FIG. 8 shows an embodiment of a filter unit FE of an HF module M, in which a control circuit STS controls the switching states of all three switches SW1, SW2, SW3. The two HF filters HF can in this case constitute the two filters of a duplexer so that only three switches are required since the common output of the duplexer is routed via the second switch SW2.
Figure 9:
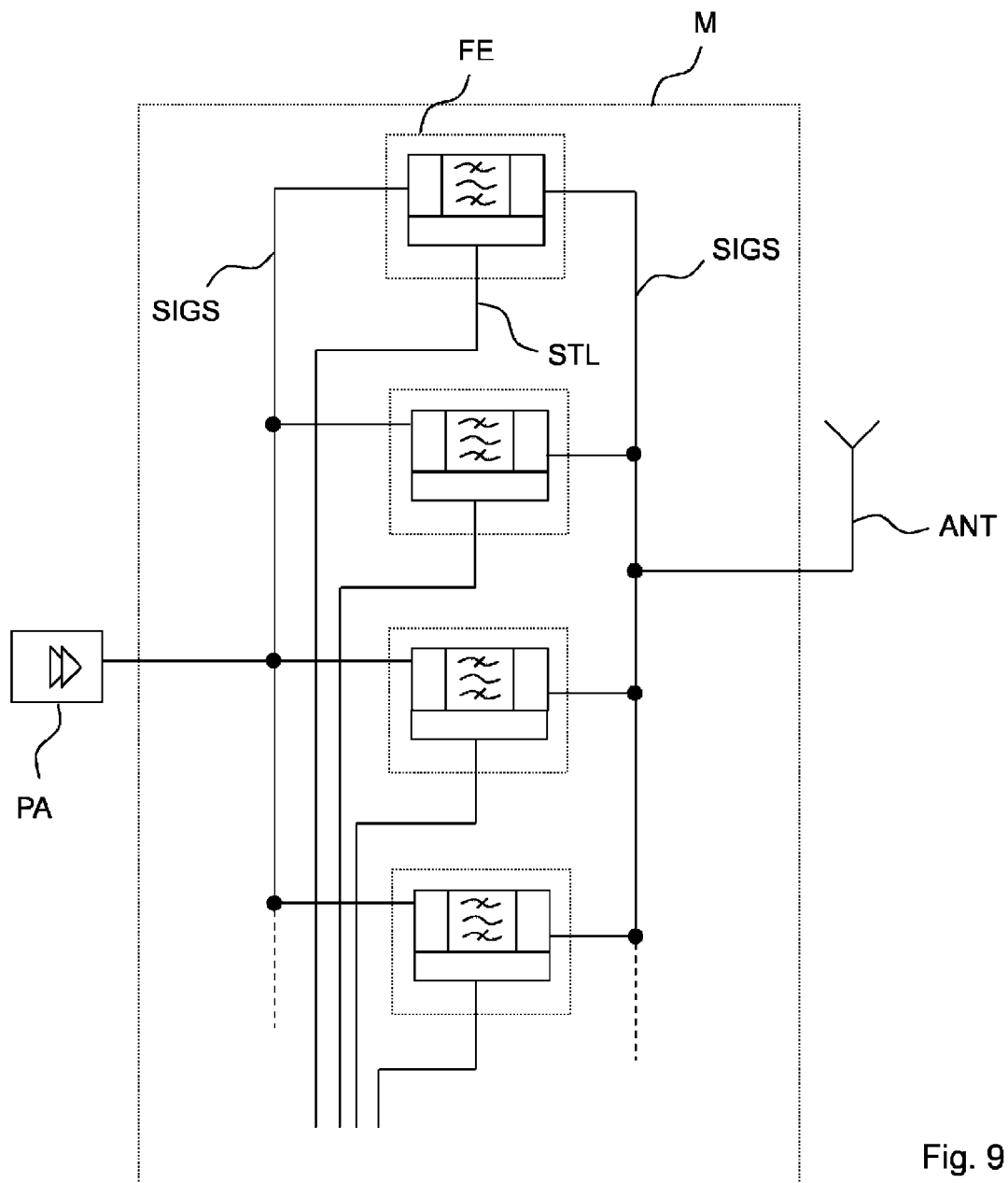

FIG. 9 shows how the module can be expanded by adding additional filter units FE. On the input side is a signal bus SIGS, which is connected to a power amplifier PA in the specific example. There is a second signal bus SIGS, which is connected to an antenna. Via the respective switches of the filter units, which can be switched via a respective control line STL, each of the filters of the filter units can be activated individually in order to open appropriate signal paths for HF signals from the amplifier to the antenna. Since only double switches are required respectively and the complexity of multi-switches is eliminated, the signal quality is improved. In a required expansion, the new construction of the respective multi-switch, via which individual filters are connected to the amplifier, is also eliminated. The amplifier PA can in this case be an MMMB-PA.

Figure 10:
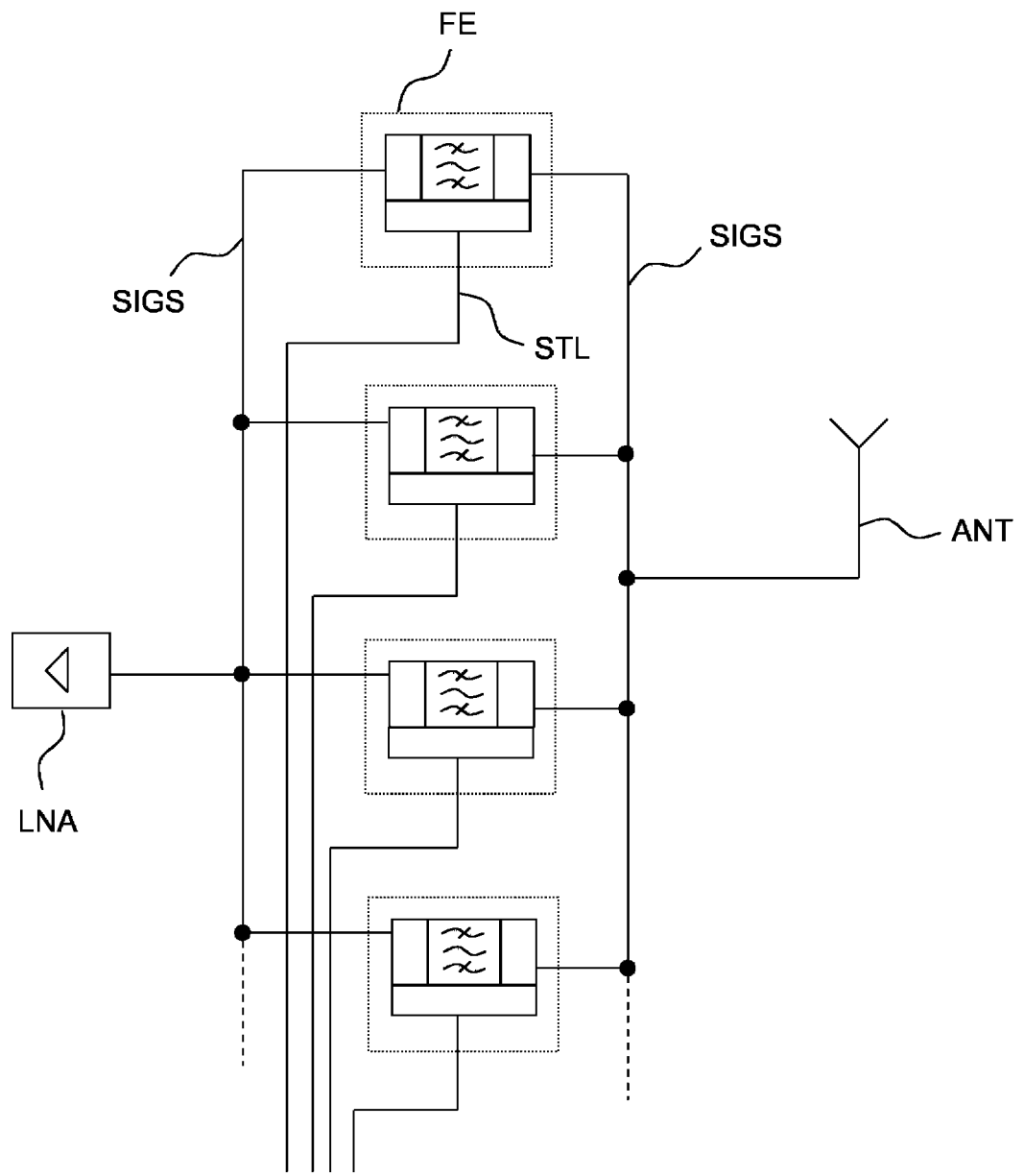

FIG. 10 shows a situation, analog to FIG. 9, for received signals.

Figure 11:
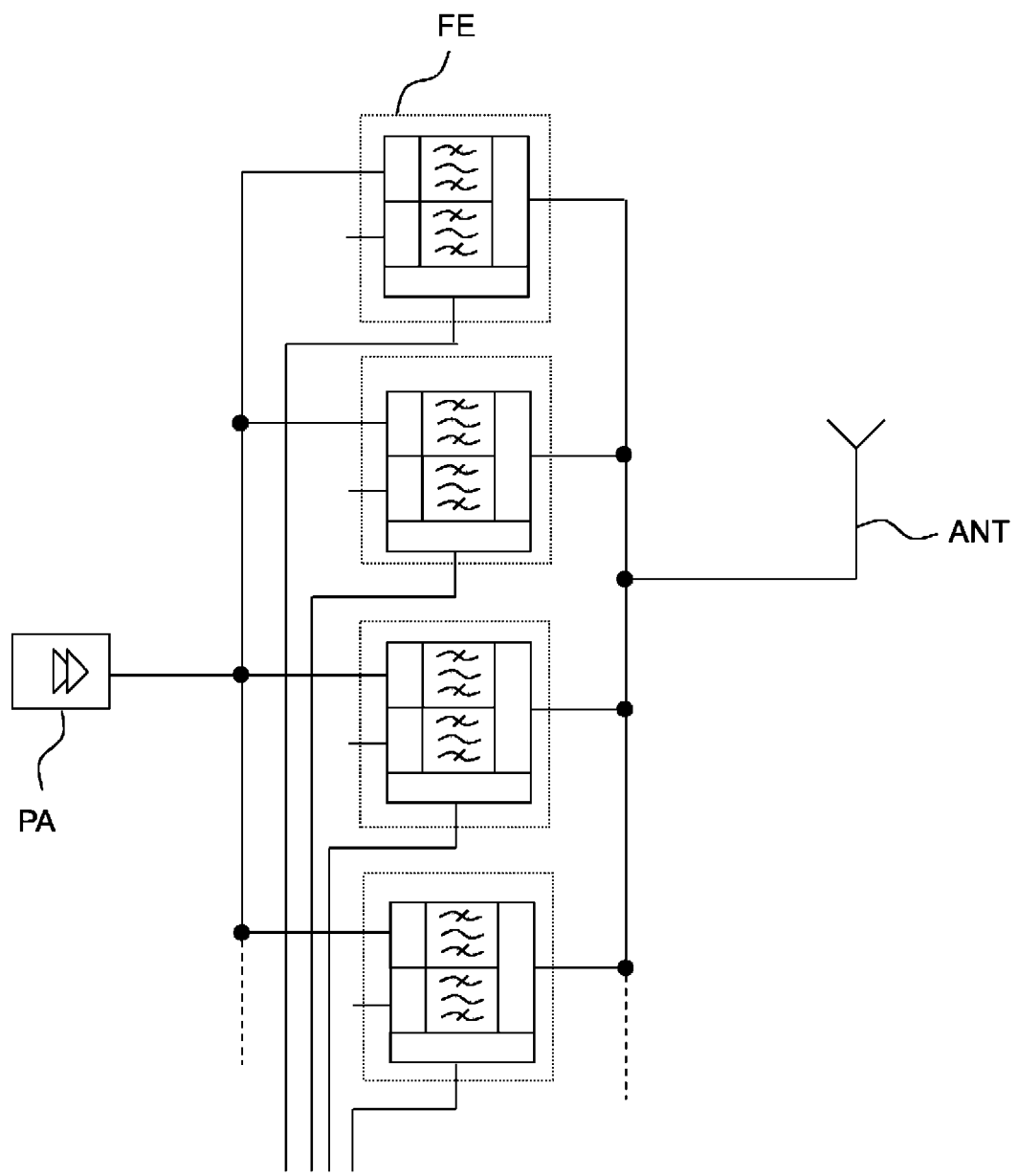

FIG. 11 shows a situation, which is analog to FIGS. 9 and 10 and in which each filter unit FE comprises two filters of a duplexer and three double switches, wherein the switching states of the three switches are controlled by a control circuit.

A signal bus is connected to a power amplifier PA. A signal bus is connected to an antenna. Another signal bus (not shown for the sake of clarity) would be connected, on the one hand, to the respective receiving filters of the duplexers and, on the other hand, to a receiving amplifier.

Figure 12:
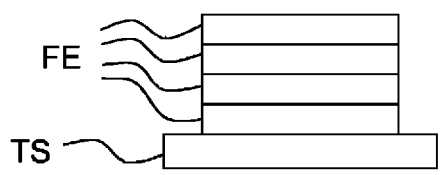

FIG. 12 illustrates how different filter units having the same topology can be stacked on top of one another on a carrier substrate TS in order to produce a compact structural element with smallest space requirement by means of 3D integration. Two or possibly three commonly used signal buses can be realized by vias, which are routed through all filter units FE.

Figure 13:
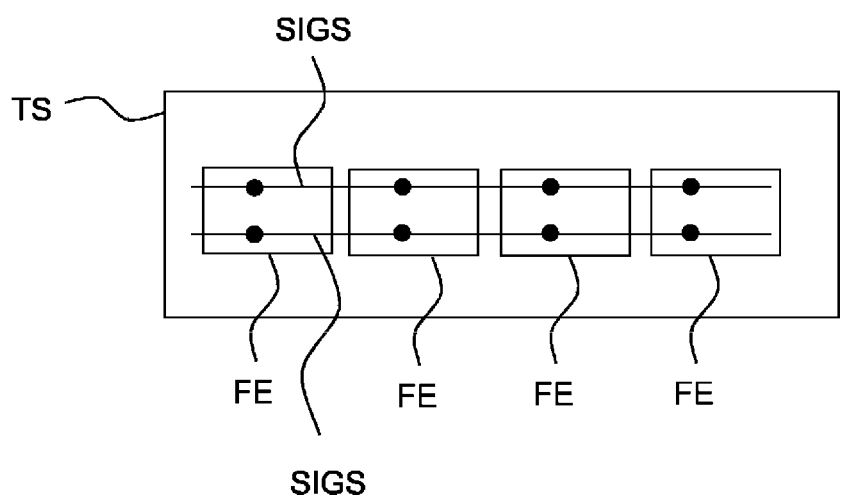

FIG. 13 shows an alternative possibility of the integration of the filter units FE on a carrier substrate TS. In this case, the different filter units FE are arranged next to one another on the carrier substrate TS and connected, for example, via through-connections to two or possibly three signal buses SIGS, which can be arranged on the top side or in metallization layers within a multi-layered carrier substrate TS.

In doing so, the HF module is not limited to the embodiments described above or shown in the figures, which embodiments are only of an exemplary nature. Modules, which comprise additional filter units, or filter units, which comprise additional filters and/or switches, also constitute possible embodiments.

REFERENCE LIST

A1: First switch connector
A2: Second switch connector
A3: Third switch connector
ANT: Antenna
FE, FE1, FE2: Filter unit
HF-F: HF filter
I: Filter input
LNA: Low-noise amplifier
M: HF module
O: Filter output
PA: Power amplifier
SIGS: Signal bus
STS: Control circuit
SW, SW1, SW2, SW3: Switch
TS: Carrier substrate
Z: Terminating impedance

The invention claimed is:

1. A high-frequency (HF) module comprising two filter units, each of the two filter units comprising:
    a first HF filter with an input and an output; and
    a first switch with two possible switching states, wherein:
        in each of the two filter units, the first switch is connected to the input or the output of the first HF filter; and
        the two filter units are connected in parallel, wherein:
            a first filter unit of the two filter units comprises a second switch with two possible switching states,
            the first switch of the first filter unit is connected to the input of the first HF filter of the first filter unit, and
            the second switch is connected to the output of the first HF filter of the first filter unit.

2. The HF module according to claim 1, wherein the first filter unit comprises a second filter with an input and an output, wherein:
    the second filter is connected in parallel to the first filter of the first filter unit, and
    the first filter unit implements a duplexer.

3. The HF module according to claim 2, wherein the first filter unit comprises a third switch with two possible switching states; and the third switch is connected to the input of the second filter.

4. The HF module according to one of the preceding claims, wherein: the first switch of the first filter unit has three connectors, and the first switch of the first filter unit is connected via a first connector of the three connectors to the first HF filter of the filter unit.

5. The HF module according to claim 4, wherein the first switch of the first filter unit is connected via a second connector of the three connectors to a terminating impedance.

6. The HF module according to one of claims 4 and 5, wherein the first switch of the first filter unit is connected with a third connector of the three connectors to a signal bus.

7. The HF module according to one of the preceding claims, wherein the first filter unit comprises a control circuit configured to control the switching states of the first and second switches of the first filter unit.

8. The HF module according to claim 6, wherein the third connector of the first switch of the first filter unit is connected to a transmission amplifier.

9. The HF module according to claim 6, wherein the third connector of the second switch is connected to an antenna connector.

10. The HF module according to claim 6, wherein the third connector of the third switch is connected to a receiving amplifier.

11. The HF module according to one of the preceding claims, wherein:
the two filter units have the same circuit topology;
the first HF filters of the two filter units are band-pass filters; and
the band-pass filters comprise different bandwidths, different center frequencies, or both different bandwidths and different center frequencies.

12. Use of an HF module according to one of the preceding claims in a mobile radio device or a mobile radio unit.

* * * * *